United States Patent
Yang et al.

(10) Patent No.: US 12,349,330 B2
(45) Date of Patent: Jul. 1, 2025

(54) SHARED PICK-UP REGIONS FOR MEMORY DEVICES

(71) Applicant: Taiwan Semiconductor Manufacturing Company, Ltd., Hsinchu (TW)

(72) Inventors: Chih-Chuan Yang, Hsinchu (TW); Chao-Yuan Chang, New Taipei (TW); Shih-Hao Lin, Hsinchu (TW); Chia-Hao Pao, Kaohsiung (TW); Feng-Ming Chang, Zhubei (TW); Lien-Jung Hung, Taipei (TW); Ping-Wei Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 483 days.

(21) Appl. No.: 17/731,781

(22) Filed: Apr. 28, 2022

(65) Prior Publication Data
US 2023/0354573 A1    Nov. 2, 2023

(51) Int. Cl.
| | |
|---|---|
| *H01L 21/78* | (2006.01) |
| *G06F 30/392* | (2020.01) |
| *G06F 30/398* | (2020.01) |
| *H10B 10/00* | (2023.01) |
| *G06F 30/3953* | (2020.01) |
| *H10D 84/85* | (2025.01) |

(52) U.S. Cl.
CPC ........... *H10B 10/18* (2023.02); *G06F 30/392* (2020.01); *G06F 30/398* (2020.01); *H10B 10/125* (2023.02); *G06F 30/3953* (2020.01); *H10D 84/854* (2025.01)

(58) Field of Classification Search
CPC ..... H10B 10/18; H10B 10/125; G06F 30/392; G06F 30/398; G06F 30/3953; H01L 27/0921; H01L 29/785
USPC .......................................................... 257/78
See application file for complete search history.

(56) References Cited

U.S. PATENT DOCUMENTS

| | | | | |
|---|---|---|---|---|
| 9,607,685 | B2* | 3/2017 | Liaw | G11C 11/419 |
| 9,691,471 | B2* | 6/2017 | Liaw | H01L 29/7827 |
| 9,824,729 | B2* | 11/2017 | Su | G11C 7/12 |
| 10,629,684 | B2* | 4/2020 | Liaw | H01L 23/5226 |
| 2020/0075606 | A1* | 3/2020 | Liaw | H01L 27/0924 |
| 2020/0251476 | A1* | 8/2020 | Chang | H01L 23/528 |
| 2020/0335585 | A1* | 10/2020 | Liaw | H01L 21/743 |

FOREIGN PATENT DOCUMENTS

TW         202030866 A       8/2020

* cited by examiner

*Primary Examiner* — Vu A Vu
(74) *Attorney, Agent, or Firm* — Sterne, Kessler, Goldstein & Fox P.L.L.C.

(57) ABSTRACT

The present disclosure describes a memory structure including a memory cell array. The memory cell array includes memory cells and first n-type wells extending in a first direction. The memory structure also includes a second n-type well formed in a peripheral region of the memory structure. The second n-type well extends in a second direction and is in contact with a first n-type well of the first n-type wells. The memory structure further includes a pick-up region formed in the second n-type well. The pick-up region is electrically coupled to the first n-type well of first n-type wells.

20 Claims, 7 Drawing Sheets

SHARED PICK-UP REGIONS FOR MEMORY DEVICES

BACKGROUND

Integrated circuits (ICs) are designed using, and manufactured based on, various cells including digital cells and analog cells. As transistors in integrated circuits become smaller in physical size and more densely placed, more design considerations are being developed to reduce leakage and prevent latch-up effects.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
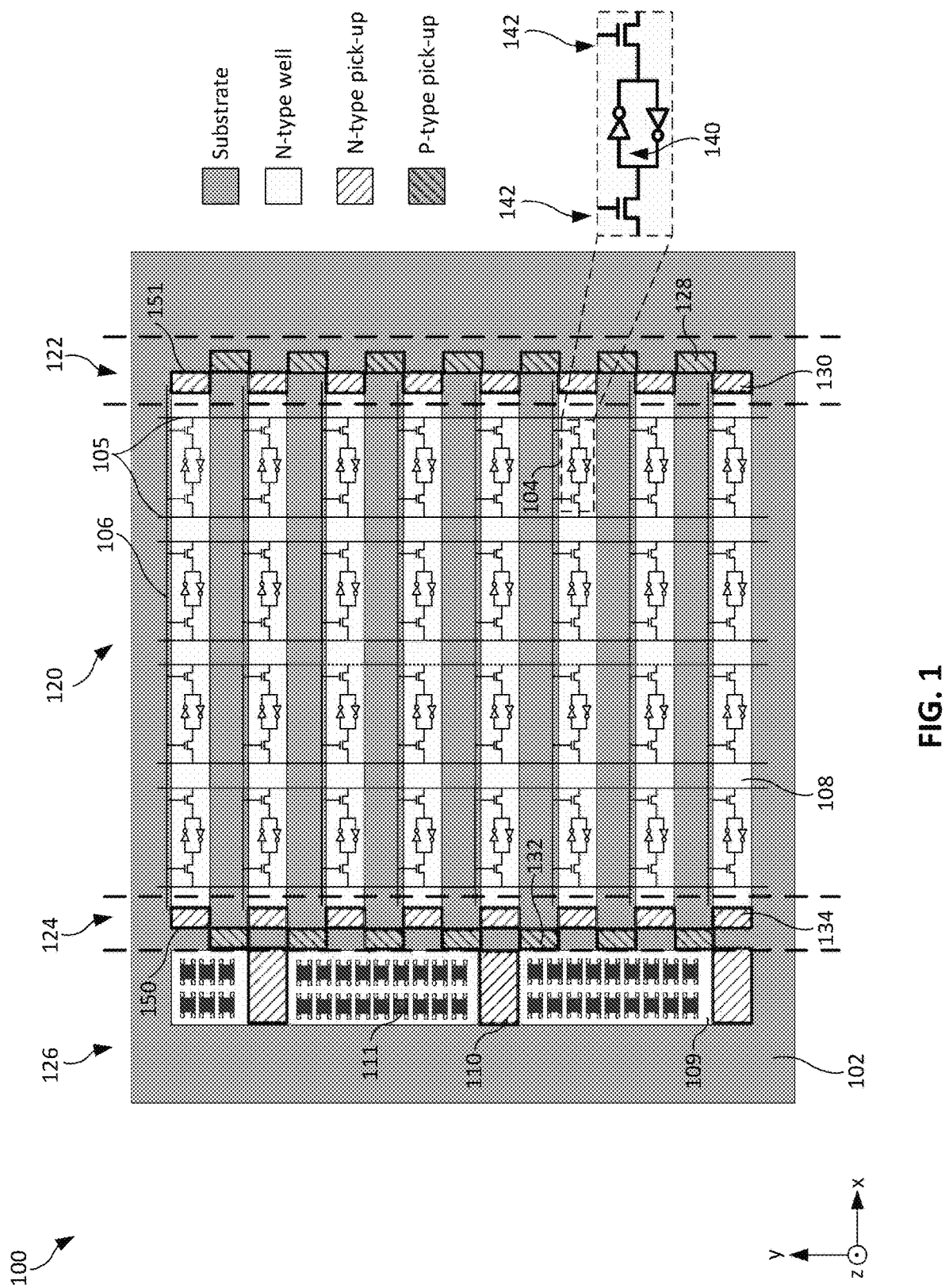
FIG. 1 is a schematic illustration of an integrated circuit layout incorporating an array of memory cells, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has generally increased while geometry size (e.g., the smallest component that can be created using a fabrication process) has decreased. This scaling down process generally provides benefits by increasing production efficiency and lowering associated costs. Such scaling down has also increased the complexity of processing and manufacturing ICs. For example, in memory devices, such as static random-access memory (SRAM) devices, leakage current issues become more severe in advanced process nodes.

SRAM generally refers to a memory or a storage device that retains stored data when power is applied, and its performance can be layout dependent. For example, an inner SRAM cell of an SRAM macro will perform differently than an edge SRAM cell of the SRAM macro. The SRAM macro of the present disclosure refers to a circuit layout that contains memory cell arrays as well as peripheral circuitry, such as pre-charge circuits, write-assist circuits, control block, I/O block, row & column decoders, etc. The peripheral circuits are coupled to SRAM cell arrays to control and/or improve read/write performance of the memory device. Pick-up regions (or areas) have been implemented in edge SRAM cells and peripheral circuits to stabilize well potentials and facilitate uniform charge distribution throughout an SRAM macro, and thus uniform performance among SRAM cells of the SRAM array. However, as circuit geometry shrinks, leakage between adjacent n-type wells (or n-wells) and p-type wells (or p-wells) becomes more severe due to dopant diffusion. This leads to higher n-type well and p-type well resistance in pick-up regions and higher pick-up resistance, which deteriorates device performance.

Various embodiments described in the present disclosure are directed to the placement of shared pick-up regions and peripheral circuits in SRAM circuits for improving device density and performance, according to some embodiments. In some embodiments, an automatic placement and routing (APR) tool can be configured to scan circuit layouts of an SRAM circuit and identify areas of the circuit layouts that are suitable for implementing pick-up regions. In some embodiments, far-end n-type wells for placing peripheral circuits (e.g., pre-charge circuits or write-assist circuits) can be placed directly adjacent to or in contact with n-type wells of the memory cell array. N-type pick-up regions formed in the far-end n-type wells can be placed directly adjacent to the n-type wells of the SRAM array. In some embodiments, gate-all-around (GAA) field-effect transistors or fin field-effect transistors (finFET) can be used in memory cells, pre-charge circuits, and/or write-assist circuits. GAA and finFET devices are developed to meet the demands for higher storage capacity, faster processing systems, higher performance, and lower associated costs. GAA and finFET devices also provides the benefit of reduced leakage current. In particular, GAA devices can reduce short channel effects and further enhance carrier mobility. The present disclosure describes forming and placing shared pick-up regions placed at or adjacent to edge SRAM cells and incorporate GAA and/or finFET devices. The shared pick-up regions can be accessed by both peripheral circuits and SRAM cells and provide the benefits of reducing device footprint and increasing device density.

FIG. 1 is a schematic illustration of an IC layout, according to some embodiments. IC layout 100 can include a substrate 102 and structures/devices formed thereon. In some embodiments, IC layout 100 illustrates an SRAM macro circuit. For clarity of description, regions of IC layout 100 can be divided into a memory cell array 120 including SRAM cells 104, a near-end SRAM edge region 122, a far-end SRAM edge region 124, and a peripheral region 126. IC layout 100 can further include other suitable structures and are not illustrated in FIG. 1 for simplicity. Components in IC layout 100 are for illustration purposes and are not drawn to scale.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Memory cell array 120 can include arrays of memory cells, such as SRAM cells 104. SRAM cells 104 are arranged in rows extending along a first direction (e.g., an x-direction) and columns extending along a second direction (e.g., a y-direction). Each column includes a pair of bit lines 105 extending along the second direction that facilitate reading data from and/or writing data to respective SRAM cells 104. Each row includes a word line 106 that facilitates access to respective SRAM cells 104 on a row-by-row basis. Each SRAM cell 104 can be electrically connected to a respective bit line 105 and a word line 106. SRAM cells 104 can include any suitable circuit elements for forming memory cells, such as a pair of cross-coupled logic inverters 140 and pull-up and pull-down transistors 142.

N-type wells 108 can be formed in memory cell array 120 and extend in the first direction (e.g., the x-direction). N-type wells 108 formed in memory cell array 120 can be formed of by doping substrate 102 with one or more suitable n-type dopants, such as phosphorus or arsenic. Each n-type well 108 can include a far-end boundary 150 (e.g., an end that is proximate to peripheral region 126) and a near-end boundary 151 (e.g., an end that is opposite to the far-end boundary). Each row of SRAM cells 104 can be formed on n-type well 108.

Pick-up regions can be formed in edge SRAM regions to stabilize well potentials and facilitate uniform charge distribution throughout an SRAM macro, and thus uniform performance among SRAM cells 104 of memory cell array 120 can be achieved. For example, p-type pick-up region 128 and n-type pick-up region 130 can be formed in near-end SRAM edge region 122. As another example, p-type pick-up region 132 and n-type pick-up region 134 can be formed in far-end SRAM edge region 124. N-type pick-up region 134 can be formed in n-type well 108. The pick-up regions can include dummy transistor devices (not illustrated in FIG. 1) having suitable terminals (e.g., dummy source/drain contacts) for coupling with external voltage potential to stabilize well potentials and facilitate uniform charge distribution throughout the SRAM macro.

Peripheral region 126 can include n-type well 109, n-type pick-up region 110, and peripheral devices 111 formed therein. In some embodiments, peripheral devices 111 can include devices for forming pre-charge circuits, write-assist circuits, control block, I/O block, row & column decoders, and any suitable devices. Detailed circuitry of peripheral devices 111 is not illustrated in FIG. 1 for simplicity. In some embodiments, n-type well 109 can be similar to n-type well 108 formed in memory cell array 120. For example, n-type well 109 can have similar dopant concentration as n-type well 108. In some embodiments, the dopant concentrations can be different. In some embodiments, n-type pick-up region 110 can be formed in n-type well 109 to stabilize well potentials and facilitate uniform charge distribution throughout peripheral region 126. In some embodiments, n-type pick-up region 110 can include dummy transistors similar to those formed in n-type pick-up region 134 and n-type pick-up region 130.

In some embodiments, dummy transistors formed in p-type pick-up region 132, n-type pick-up region 134, and n-type pick-up region 110 can be formed using planar transistor devices that are more susceptible to leakage current or diffusion between well structures. To prevent cross-well diffusion such as diffusions between p-type pick-up region 132 and n-type pick-up region 134, p-type pick-up region 132 formed in far-end SRAM edge region 124 can have an offset in a first direction (e.g., the x-direction) from n-type pick-up region 134, as shown in FIG. 1.

Figure 2:
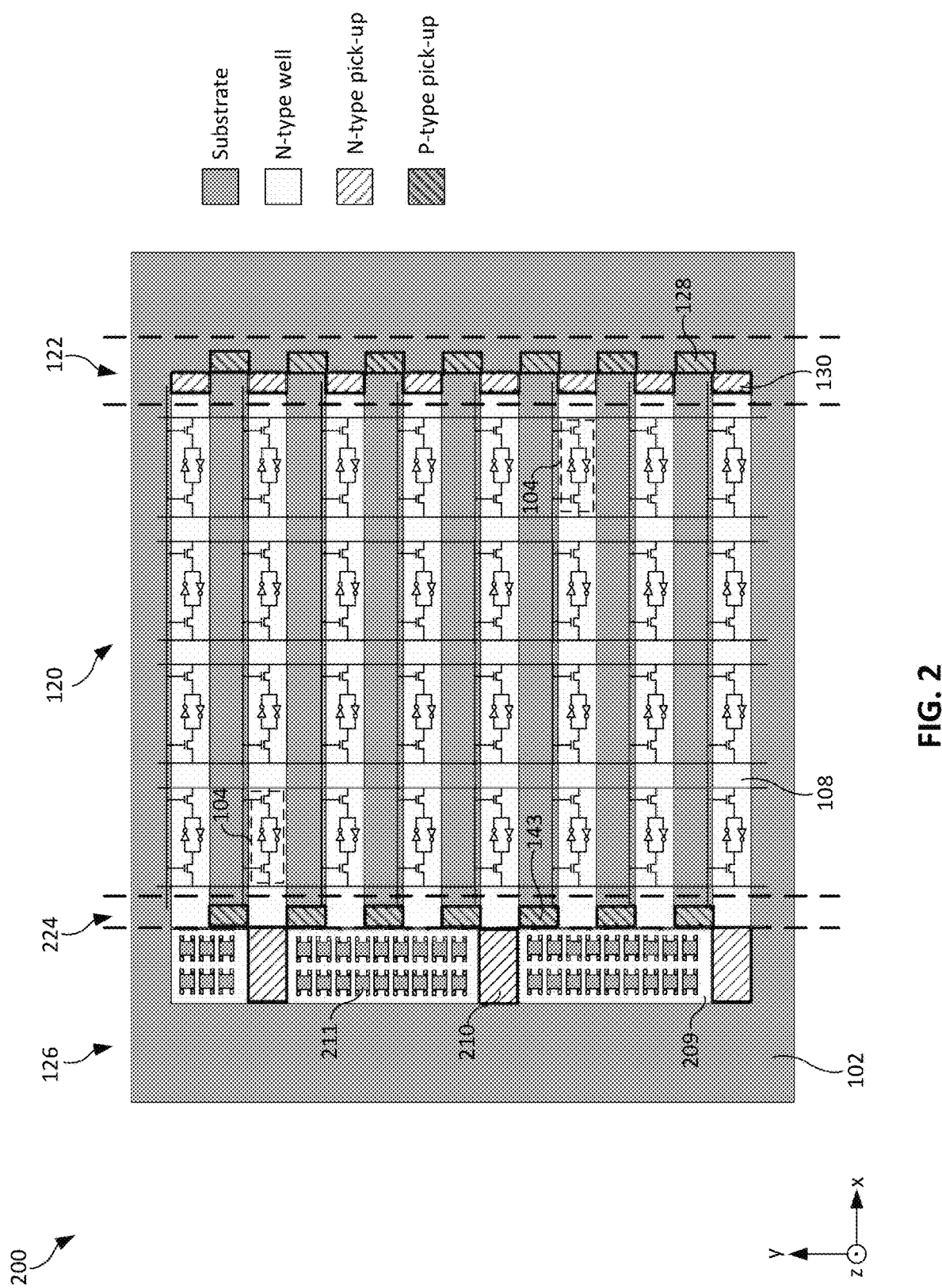
FIG. 2 is a schematic illustration of an integrated circuit layout incorporating shared pick-up regions and an array of memory cells, according to some embodiments.

FIG. 2 is a schematic illustration of an IC layout incorporating shared pick-up regions between peripheral regions and SRAM edge regions, according to some embodiments. IC layout 200 illustrates a memory structure that can include a far-end SRAM edge region 224, an n-type well 209, and shared n-type pick-up regions 210. Peripheral circuits, such as pre-charge circuits and write-assist circuits for memory cell array 120, can be formed in n-type well 209. In some embodiments, the peripheral circuits can include peripheral devices 211 that are formed using GAA and/or finFET structures. In some embodiments, peripheral devices 211 can form a pre-charge circuit coupled to memory cell 120. In some embodiments, IC layout 200 illustrates an SRAM macro circuit. Components in IC layout 200 are for illustration purposes and are not drawn to scale. Same reference numerals in FIGS. 1 and 2 generally indicate identical, functionally similar, and/or structurally similar elements.

In contrast to n-type well 109 being electrically and physically separated from n-type well 108 as illustrated in FIG. 1, n-type well 209 illustrated in FIG. 2 can be formed adjacent to or in contact with n-type well 108 such that n-type well 209 and n-type well 108 can be electrically coupled to each other. Shared n-type pick-up region 210 can be formed in n-type well 209 and also electrically coupled to n-type well 108 through n-type well 209. P-type pick-up region 143 can be formed adjacent to or in contact with n-type well 108 and n-type well 209. In some embodiments, p-type pick-up region 143 can also abut shared pick-up region 210. Active transistor structures of peripheral devices 211, dummy transistor structures of shared n-type pick-up region 210, and dummy transistor structures of p-type pick-up region 143 can be formed using GAA and/or finFET structures. Therefore, the aforementioned structures can be placed adjacent to or in contact with each other as illustrated in FIG. 2 because diffusion between adjacent wells and transistor structures of GAA and finFET structures can be lower compared to peripheral devices and pick-up regions illustrated in FIG. 1 that are formed using planar transistor structures.

N-type well 209 and n-type well 108 can be adjacent to or in contact with each other, and are therefore electrically coupled with each other. Therefore, shared n-type pick-up region 210 can be electrically accessed by both peripheral devices 211 in peripheral region 126 and SRAM cells 104 in memory cell array 120. For example, voltage potentials applied to shared n-type pick-up region 210 can stabilize well potentials and facilitate uniform charge distribution throughout n-type well 209 and n-type well 108. As n-type well 209 is placed closer to n-type well 108 than n-type well 109 with respect to n-type well 108 in FIG. 1, a device footprint of IC layout 200 can be smaller than a device footprint of IC layout 100 of FIG. 1, which in turn results in IC layout 200 having a higher device density than the device density of IC layout 100.

Figure 3:
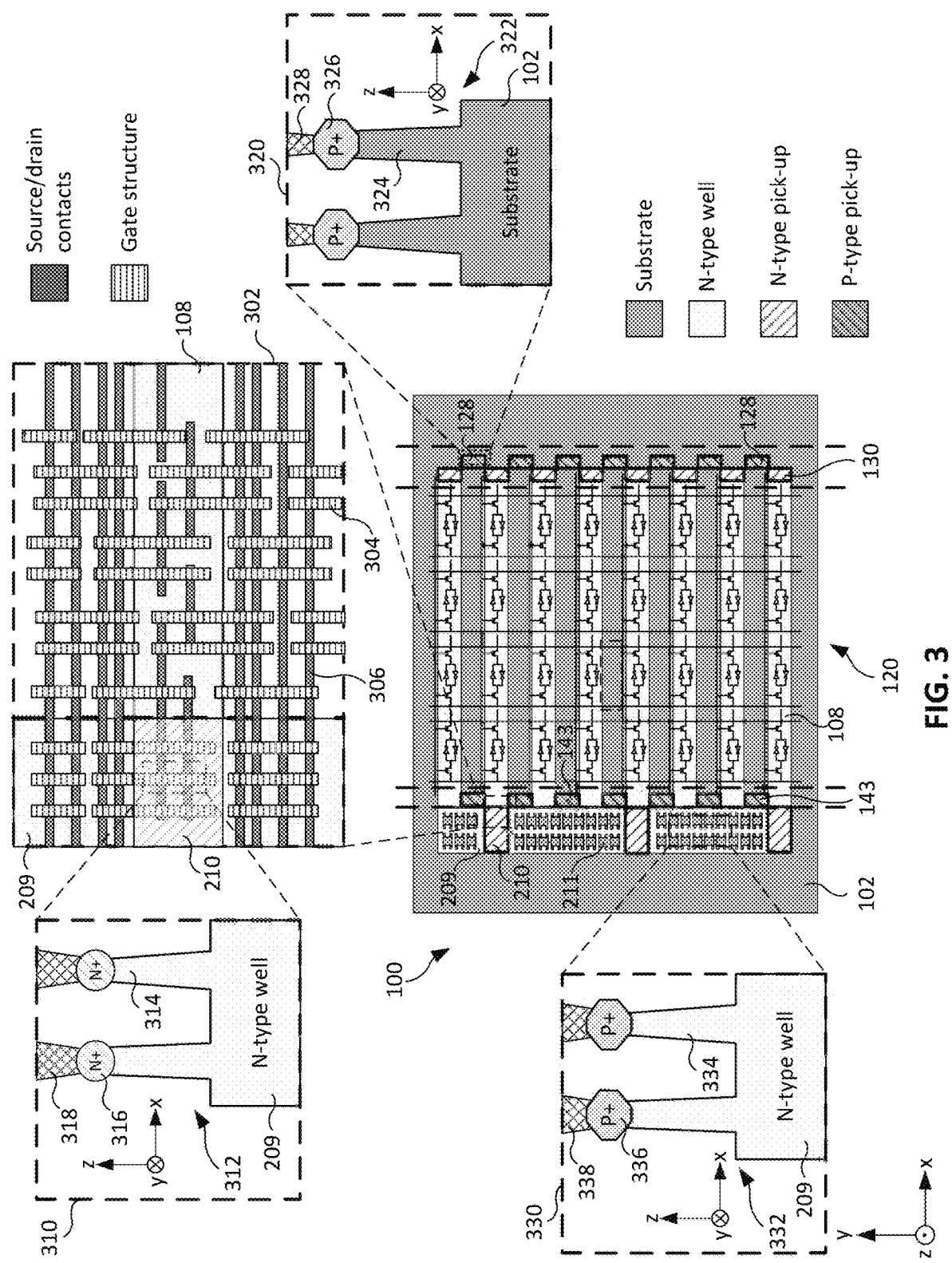
FIG. 3 includes schematic illustrations of various enlarged views of the integrated circuit layout of FIG. 2, according to some embodiments.

FIG. 3 is various schematic illustrations of regions of an IC layout incorporating shared pick-up regions between peripheral regions and SRAM edge regions, according to some embodiments. The enlarged schematic illustrations of FIG. 3 are described with reference to IC layout 200 described in FIG. 2, and same reference numerals in FIGS. 2 and 3 generally indicate identical, functionally similar, and/or structurally similar elements. Components in the illustrations of FIG. 3 are for illustration purposes and are not drawn to scale.

Enlarged view 302 illustrates a top down layout view of portions of n-type well 209, shared n-type pick-up region 210, n-type well 108, and transistor structures formed within the aforementioned regions. As shown in enlarged view 302, gate structures 304 extend substantially along the second direction (e.g., the y-direction) and source/drain contact structures 306 extend substantially along the first direction (e.g., the x-direction). In some embodiments, gate structures 304 and source/drain contact structures 306 can be components of GAA or finFET structures. For example, gate structures 304 can be formed using poly silicon material and be referred to as "polygates." As shown in enlarged view 302, n-type well 209 is in direct or physical contact with n-type well 108, and therefore are electrically couple with each other.

Further enlarged view 310 is a schematic illustration of a dummy transistor structure 312 that is formed in shared n-type pick-up region 210. Dummy transistor structure 312 can be a GAA device and includes transistor channels formed using nanostructures (not illustrated in enlarged view 310 for simplicity). Dummy transistor structure 312 can include fin structures 314, source/drain structures 316, and source/drain contacts 318. In some embodiments, fin structures 314 can be formed on n-type well 209 using suitable patterning and etching processes. In some embodiments, fin structures 314 and source/drain structures 316 can both be doped using n-type dopants such that fin structures 314, source/drain structures 316, and n-type well 209 form a conductive path. In some embodiments, fin structures 314 can be doped using n-type dopants similar to those used in n-type well 209. In some embodiments, a dopant concentration of source/drain structures 316 can be higher than a dopant concentration of fin structures 314 or n-type well 209. In some embodiments, source/drain contacts 318 can be formed using a conductive material, such as tungsten, cobalt, copper, doped silicon material, or any suitable conductive material.

Enlarged view 320 is a schematic illustration of dummy transistor structure 322 that is formed in p-type pick-up region 128 and/or p-type pick-up region 143. Dummy transistor structure 322 can be a GAA device and includes transistor channels formed using nanostructures (not illustrated in enlarged view 320 for simplicity). Dummy transistor structure 322 can include fin structures 324, source/drain structures 326, and source/drain contacts 328. In some embodiments, fin structures 324 can be formed on substrate 102 using suitable patterning and etching processes. In some embodiments, fin structures 324 and source/drain structures 326 can both be doped using p-type dopants such that fin structures 324, source/drain structures 326, and substrate 102 form a conductive path. In some embodiments, fin structures 324 can be doped using p-type dopants similar to those used in substrate 102. In some embodiments, a dopant concentration of source/drain structures 326 can be higher than a dopant concentration of fin structures 324 or substrate 102. In some embodiments, source/drain contacts 328 can be formed using a conductive material, such as tungsten, cobalt, copper, doped silicon material, or any suitable conductive material.

Enlarged view 330 is a schematic illustration of active transistor structure 332 that is formed in n-type well 209. Active transistor structure 332 can be a GAA device and includes transistor channels formed using nanostructures (not illustrated in enlarged view 330 for simplicity). In some embodiments, active transistor structure 332 can be a p-type metal-oxide-semiconductor (PMOS) device and form pre-charge circuitry for memory cell array 120. Active transistor structure 332 can form peripheral devices 211 and can include fin structures 334, source/drain structures 336, and source/drain contacts 338. In some embodiments, fin structures 334 can be formed on n-type well 209 using suitable patterning and etching processes. In some embodiments, fin structures 334 and source/drain structures 336 can both be doped using p-type dopants. In some embodiments, source/drain contacts 338 can be formed using a conductive material, such as tungsten, cobalt, copper, doped silicon material, or any suitable conductive material.

Figure 4:
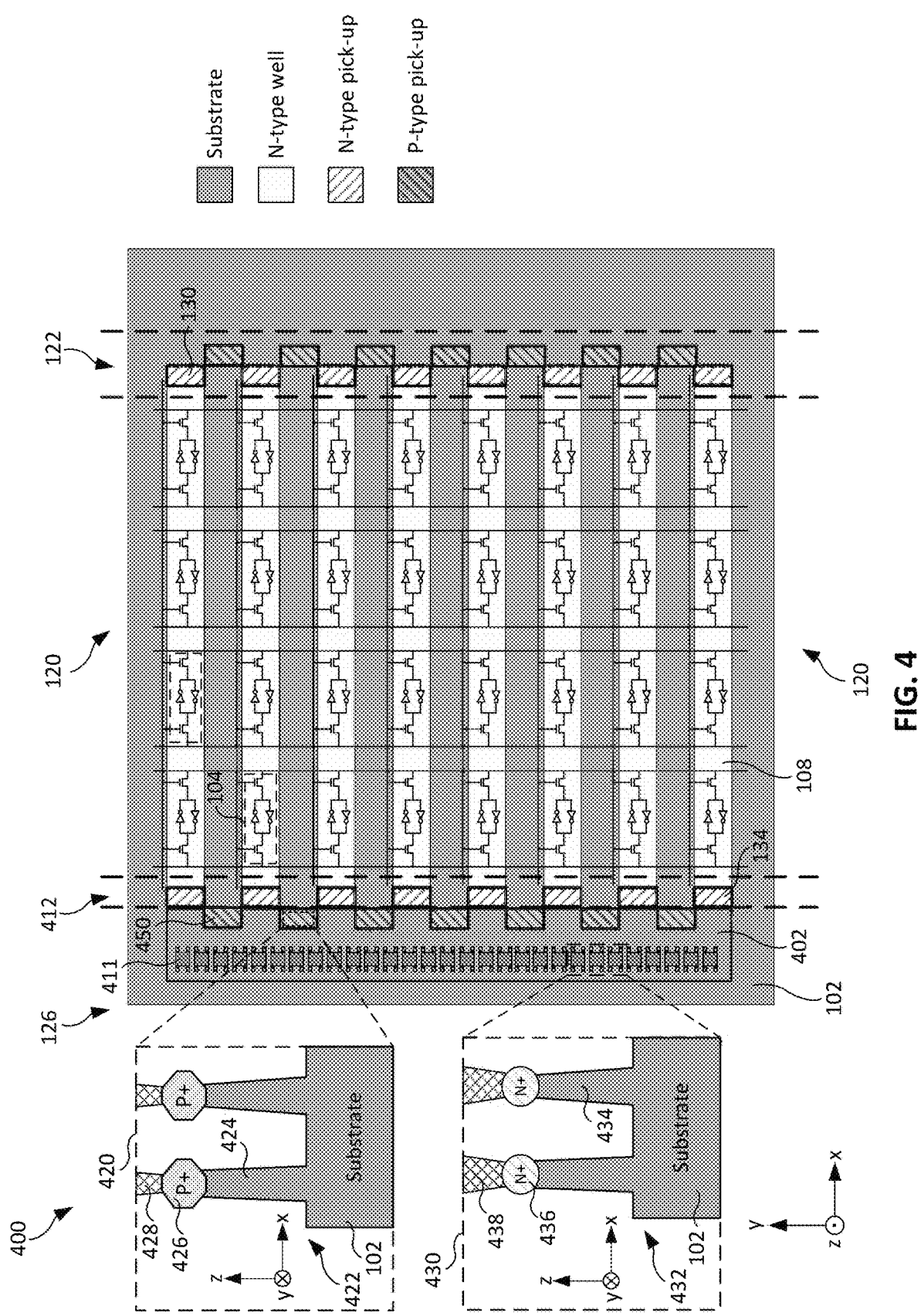
FIG. 4 is a schematic illustration of an integrated circuit layout incorporating shared pick-up regions and an array of memory cells, according to some embodiments.

FIG. 4 is a schematic illustration of an IC layout incorporating shared pick-up regions between peripheral regions and SRAM edge regions, according to some embodiments. IC layout 400 illustrates a memory structure that can include a far-end SRAM edge region 412 and shared p-type pick-up regions 450. Peripheral circuits, such as pre-charge circuits and write-assist circuits for memory cell array 120, can be formed in peripheral region 126. In some embodiments, the peripheral circuits can include peripheral devices 411 that are formed using GAA and/or finFET structures. In some embodiments, IC layout 400 illustrates an SRAM macro circuit. Components in IC layout 400 are for illustration purposes and are not drawn to scale. Same reference numerals in FIGS. 1-4 generally indicate identical, functionally similar, and/or structurally similar elements.

Shared p-type pick-up regions 450 illustrated in FIG. 4 can be formed between rows of SRAM cells 104 and abutting n-type pick-up regions, such as n-type pick-up regions 134. In some embodiments, shared p-type pick-up region 450 can be placed to be in contact with n-type pick-up regions 134. In some embodiments, a p-type well 402 can be formed in peripheral region 126 and in substrate 102. In some embodiments, substrate 102 can be doped with p-type dopants, and p-type well 402 can have a dopant concentration that is greater than or substantially equal to the dopant concentration of substrate 102. In some embodiments, shared p-type pick-up region 450 can be formed in p-type well 402 or directly in substrate 102.

In some embodiments, additional circuitry (not illustrated in FIG. 4) can be formed in substrate 102 and between rows of SRAM cells 104. Both the additional circuitry and peripheral devices 411 can access shared p-type pick-up region 450. For example, voltage potentials applied to shared p-type pick-up region 450 can stabilize well potentials and facilitate uniform charge distribution throughout peripheral region 126 and circuits between rows of SRAM cells 104. Active transistor structures of peripheral devices 411, dummy transistor structures of n-type pick-up region 134, and dummy transistor structures of shared p-type pick-up region 450 can be formed using GAA and/or finFET structures. Therefore, the aforementioned structures can be placed adjacent to or in contact with each other as illustrated in FIG. 4 because diffusion between adjacent wells and transistor structures of GAA and finFET structures can be lower compared to peripheral devices and pick-up regions illustrated in FIG. 1 that are formed using planar transistor structures.

Enlarged view 420 is a schematic illustration of a dummy transistor structure 422 that is formed in shared p-type pick-up region 450. Dummy transistor structure 422 can be a GAA device and includes transistor channels formed using nanostructures (not illustrated in enlarged view 420 for simplicity). Dummy transistor structure 422 can include fin structures 424, source/drain structures 426, and source/drain contacts 428. In some embodiments, fin structures 424 can be formed on substrate 102 using suitable patterning and etching processes. In some embodiments, fin structures 424 and source/drain structures 426 can both be doped using p-type dopants such that fin structures 424, source/drain structures 426, and substrate 102 form a conductive path. In some embodiments, both fin structures 424 and substrate 102 can be doped using p-type dopants. In some embodiments, a dopant concentration of source/drain structures 426 can be higher than a dopant concentration of fin structures 424 or substrate 102. In some embodiments, source/drain contacts 428 can be formed using a conductive material, such as tungsten, cobalt, copper, doped silicon material, or any suitable conductive material.

Enlarged view 430 is a schematic illustration of active transistor structures 432 that form peripheral device 411. Active transistor structures 432 can be GAA devices and include transistor channels formed using nanostructures (not illustrated in enlarged view 430 for simplicity). Active transistor structure 432 can include fin structures 434, source/drain structures 436, and source/drain contacts 438. In some embodiments, fin structures 434 can be formed on substrate 102 using suitable patterning and etching processes. In some embodiments, fin structures 434 can be doped using p-type dopants. In some embodiments, fin structures 434 can be doped using p-type dopants similar to those used in substrate 102. In some embodiments, source/drain contacts 438 can be formed using a conductive material, such as tungsten, cobalt, copper, doped silicon material, or any suitable conductive material.

In some embodiments, IC layout in FIG. 1 can be used where a larger area of IC is available for placing pick-up regions. In some embodiments, IC layouts in FIGS. 2-4 can be used where a smaller area of IC is available for placing pick-up regions. Shared pick-up regions in FIGS. 2-4 can reduce device footprint and can be suitable for a smaller IC area.

Figure 5:
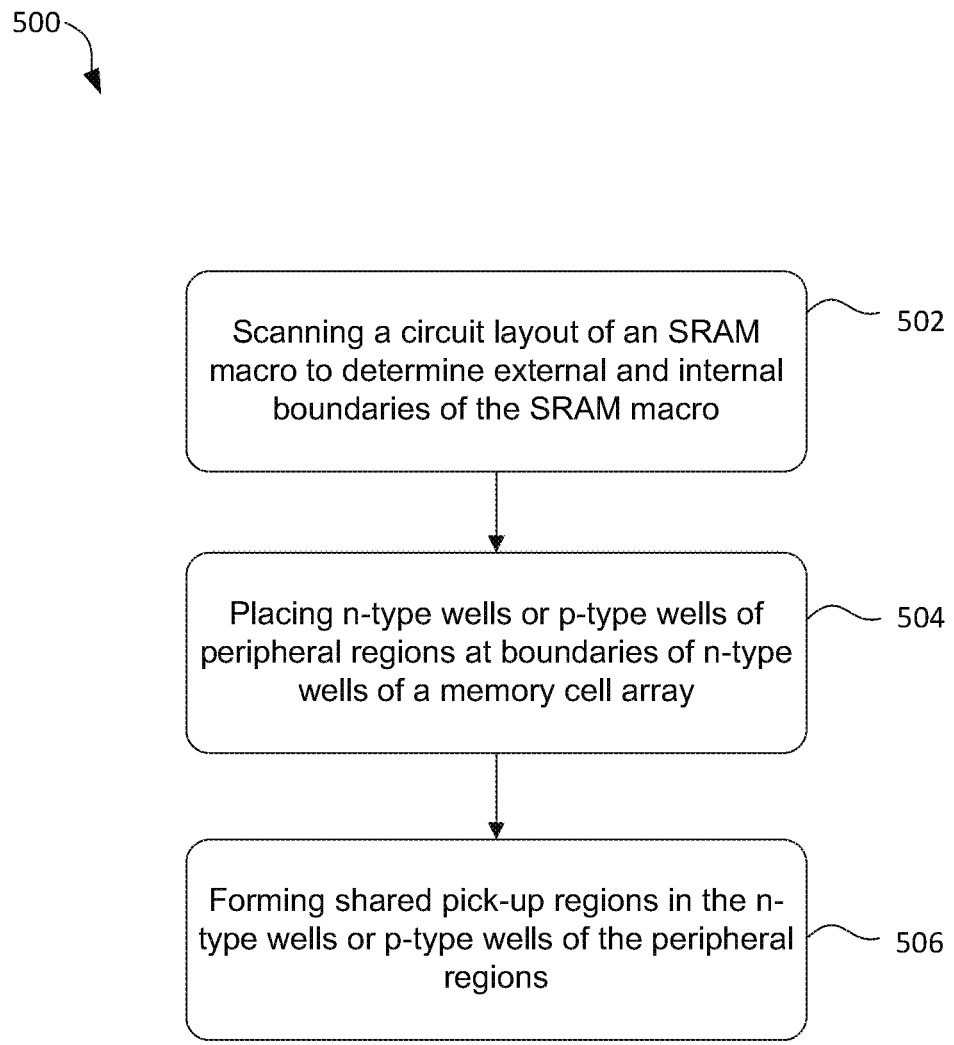
FIG. 5 is a flow diagram of a method for placing shared pick-up regions in an integrated circuit, according to some embodiments.

FIG. 5 is a flow diagram of a method 500 for forming shared pick-up regions in IC layouts, in accordance with some embodiments of the present disclosure. It should be noted that the operations of method 500 can be performed in a different order and/or vary, and method 500 may include more operations that are not described for simplicity. Although processes for forming shared pick-up regions are described as examples, the formation process can be applied to various suitable semiconductor structures. The described formation processes are exemplary, and alternative processes in accordance with this disclosure may be performed that are not shown in the figures.

At operation 502, a circuit layout of an SRAM macro is scanned to determine external and internal boundaries of the SRAM macro, according to some embodiments of the present disclosure. Referring to FIG. 2, IC layout 200 including an SRAM macro can be scanned to determine external boundaries, such as boundaries of IC layout 200, and internal boundaries, such as boundaries of memory cell array 120, near-end SRAM edge region 122, far-end SRAM edge region 224, and peripheral region 126. In some embodiments, boundaries of n-type well 108 of memory cell array 120 are also determined.

At operation 504, n-type wells or p-type wells of peripheral regions are placed at boundaries of n-type wells of a memory cell array, according to some embodiments of the present disclosure. In some embodiments, referring to FIG. 2, n-type well 209 can be placed adjacent to or in contact with n-type well 108 such that n-type well 209 and n-type well 108 can be electrically coupled to each other. In some embodiments, referring to FIG. 4, p-type well 402 is placed adjacent to or in contact with n-type wells 108 and portions of substrate 102 that is between adjacent rows of SRAM cells 104.

At operation 506, shared pick-up regions can be formed in the n-type wells or p-type wells of the peripheral regions, according to some embodiments of the present disclosure. Referring to FIG. 2, shared n-type pick-up region 210 can be placed in n-type well 209. Shared n-type pick-up region 210 can be electrically accessed by both peripheral devices 211 in peripheral region 126 and SRAM cells 104 in memory cell array 120 through the electrically coupled n-type well 209 and n-type well 109. For example, voltage potentials applied to shared n-type pick-up region 210 can stabilize well potentials and facilitate uniform charge distribution throughout n-type well 209 and n-type well 108. Referring to FIG. 4, shared p-type pick-up region 450 can be placed in p-type well 402 or directly in substrate 102 if p-type well 402 is not formed due to design preference and needs. Shared p-type pick-up region 450 can be electrically accessed by both peripheral devices 411 in peripheral region 126 and circuits formed between rows of SRAM cells 104 in memory cell array 120 through the electrically coupled p-type well 402 (if formed) and substrate 102 within memory cell array 120. For example, voltage potentials applied to shared p-type pick-up region 450 can stabilize well potentials and facilitate uniform charge distribution throughout p-type well 402 and substrate 102. Implementing shared pick-up regions can provide the benefit of, among other things, a higher device density and smaller device footprint.

Figure 6:
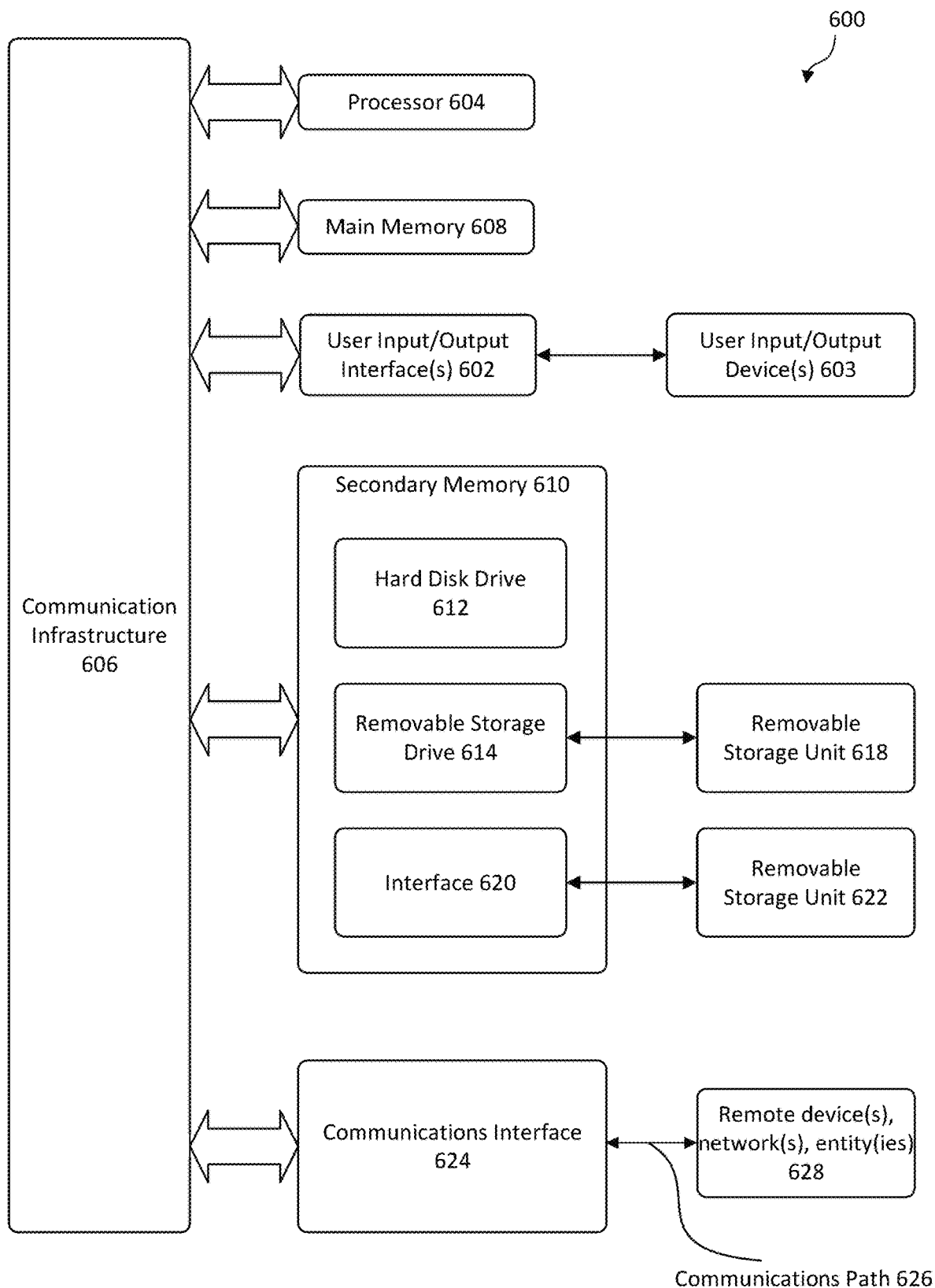
FIG. 6 is an illustration of an exemplary computer system for implementing various embodiments of the present disclosure, according to some embodiments.

FIG. 6 is an illustration of an example computer system 600 in which various embodiments of the present disclosure can be implemented, according to some embodiments. Computer system 600 can be any computer capable of performing the functions and operations described herein. For example, and without limitation, computer system 600 can be capable of scanning SRAM circuit layout areas, identifying boundaries of memory arrays, placing and routing shared pick-up regions, among other things. In some embodiments, computer system 600 can be an electronic design automation (EDA) tool. Computer system 600 can be used, for example, to execute one or more operations in methods 500 and 700, which describes exemplary methods for forming and placing shared pick-up regions in memory circuits.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. An EDA tool can receive instructions to implement functions and operations described herein—e.g., method 500 of FIG. 5 and method 700 of FIG. 7—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the operations described herein with respect to method 500 of FIG. 5 and method 700 of FIG. 7. For example, main memory 608 can include a non-transitory computer-readable medium having instructions stored thereon that, when executed by computer system 600, causes computer system 600 to perform operations, such as forming shared pick-up regions in memory circuits.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/or any other computer data storage device. Removable storage drive 614 reads from and/or writes to removable storage unit 618 in a well-known manner.

According to some embodiments, secondary memory 610 can include other means, instrumentalities or other approaches for allowing computer programs and/or other instructions and/or data to be accessed by computer system 600. Such means, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the operations described herein with respect to method 500 of FIG. 5 and method 700 of FIG. 7.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The operations in the preceding embodiments can be implemented in a wide variety of configurations and architectures. Therefore, some or all of the operations in the embodiments herein—e.g., method 500 of FIG. 5 and method 700 of FIG. 7 (described below)—can be performed in hardware, in software, or both. In some embodiments, a tangible apparatus or article of manufacture comprising a tangible computer useable or readable medium having control logic (software) stored thereon is also referred to herein as "a computer program product" or "a program storage device." This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. In some embodiments, computer system 600 is installed with software to perform operations in the manufacturing of photomasks and circuits, as illustrated in method 700 of FIG. 7 (described below). In some embodiments, computer system 600 includes hardware/equipment for the manufacturing of photomasks and circuit fabrication. For example, the hardware/equipment can be connected to or be part of remote devices 628 (remote device(s), network(s), entity(ies)) of computer system 600.

Figure 7:
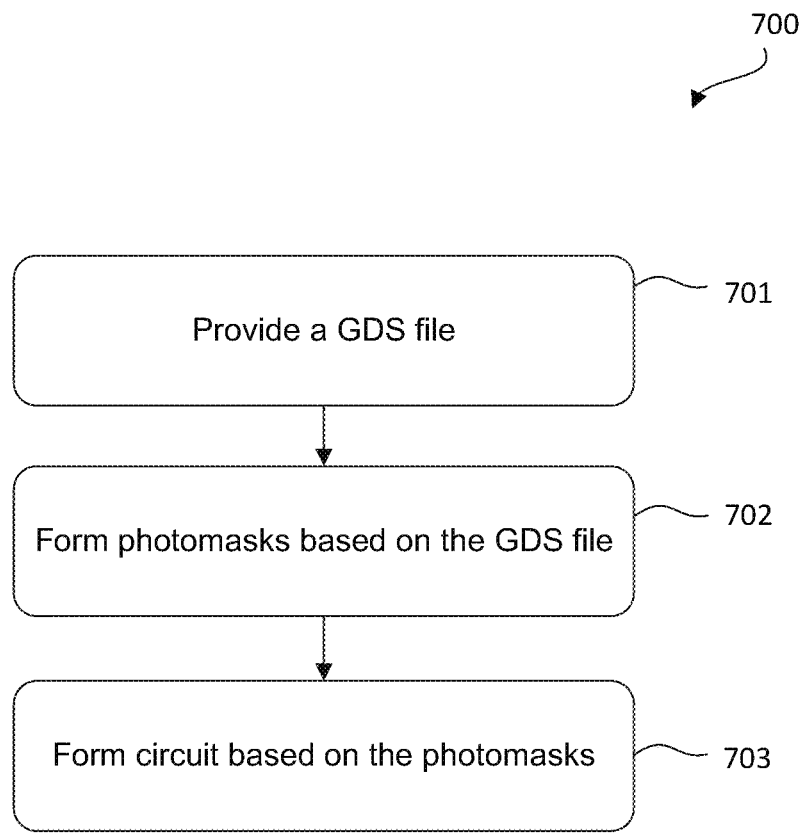
FIG. 7 is an illustration of a process to form standard cell structures and conductive line placement and routing based on a graphic database system (GDS) file, according to some embodiments.

FIG. 7 is an illustration of an exemplary method 700 for circuit fabrication, according to some embodiments. In some embodiments, operations/steps of method 700 can be performed in a different order. Variations of method 700 should also be within the scope of the present disclosure.

In operation 701, a GDS file is provided. The GDS file can be generated by an EDA tool and include standard cell structures optimized based on the present disclosure. The operation depicted in operation 701 can be performed by, for example, an EDA tool that operates on a computer system, such as computer system 600 described above.

In operation 702, photomasks are formed based on the GDS file. In some embodiments, the GDS file provided in operation 701 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 702 can be performed by a photomask manufacturer, where the circuit layout is read using a suitable software tool (e.g., an EDA tool) and the circuit layout is transferred onto a substrate using a suitable printing/deposition tool. The photomasks reflect the circuit layout/features included in the GDS file.

In operation 703, one or more circuits are formed based on the photomasks generated in operation 702. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

Various embodiments described in the present disclosure are directed to the placement of shared pick-up regions and peripheral circuits in SRAM circuits for improving device density and performance, according to some embodiments. In some embodiments, an APR tool can be configured to scan circuit layouts of an SRAM circuit and identify areas of the circuit layouts that are suitable for implementing pick-up regions. In some embodiments, far-end n-type wells for placing peripheral circuits (e.g., pre-charge circuits or write-assist circuits) can be placed directly adjacent to or in contact with n-type wells of the memory cell array. N-type pick-up regions formed in the far-end n-type wells can be placed directly adjacent to the n-type wells of the SRAM array. In some embodiments, GAA or finFET devices can be used in memory cells, pre-charge circuits, and/or write-assist circuits. The shared pick-up regions can be placed at or adjacent to edge SRAM cells and incorporate GAA and/or finFET devices. The shared pick-up regions can be accessed by both peripheral circuits and SRAM cells and provide the benefits of reducing device footprint and increasing device density. The shared pick-up regions can also provide the benefit of stabilizing well potentials and facilitating uniform charge distribution throughout the SRAM circuit, and thus uniform performance among SRAM cells of the SRAM array.

In some embodiments, a memory structure includes a memory cell array. The memory cell array includes memory cells and first n-type wells extending in a first direction. The memory structure also includes a second n-type well formed in a peripheral region of the memory structure. The second n-type well extends in a second direction and is in contact with one of the first n-type wells. The memory structure further includes a pick-up region formed in the second n-type well. The pick-up region is electrically coupled to the first n-type well of first n-type wells.

In some embodiments, a memory structure includes a memory cell array. The memory cell array includes memory cells and first n-type wells extending in a first direction. Each of the first n-type wells includes a far-end boundary and a near-end boundary opposite to the far-end boundary. The memory structure further includes a second n-type well extending in a second direction perpendicular to the first direction. The second n-type well is in contact with the far-end boundary of the each of the first n-type wells. The memory structure also includes pick-up regions formed in the second n-type well. Each pick-up region is electrically coupled to the each of the first n-type well of the first n-type wells.

In some embodiments, a method includes scanning a circuit layout of a memory structure, wherein the memory structure includes (i) first n-type wells extending in a first direction; and (ii) memory cells formed on the first n-type wells. The method also includes determining a far-end boundary and a near-end boundary of one of the first n-type wells and placing a second n-type well extending in a second direction perpendicular to the first direction. The second n-type well is in contact with one or more far-end boundaries of the first n-type wells. The method also includes placing pick-up regions in the second n-type well.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A memory structure, comprising:
a memory cell array comprising:
a plurality of memory cells; and
a plurality of first n-type wells extending in a first direction;
a second n-type well formed in a peripheral region of the memory structure, wherein the second n-type well extends in a second direction and is in contact with one of the plurality of first n-type wells; and
a pick-up region formed in the second n-type well, wherein the pick-up region is electrically coupled to the one of the plurality of first n-type wells via a second pick-up region.

2. The memory structure of claim 1, wherein each of the plurality of first n-type wells comprises a far-end boundary and a near-end boundary opposite to the far-end boundary.

3. The memory structure of claim 2, wherein the second n-type well is in contact with a plurality of far-end boundaries.

4. The memory structure of claim 1, further comprising a pre-charge circuit formed in the second n-type well.

5. The memory structure of claim 4, wherein the pick-up region is electrically coupled to the pre-charge circuit.

6. The memory structure of claim 4, wherein the pre-charge circuit comprises a gate-all-around (GAA) device, wherein the GAA device comprises an n-type fin structure formed on the second n-type well and a p-type doped source/drain region on the n-type fin structure.

7. The memory structure of claim 1, wherein the pick-up region comprises a gate-all-around (GAA) device, wherein the GAA device comprises an n-type fin structure formed on the second n-type well and an n-type doped source/drain region on the n-type fin structure.

8. The memory structure of claim 1, wherein the memory structure further comprises another pick-up region formed between a first row of the plurality of memory cells and a second row of the plurality of memory cells, and wherein the other pick-up region is in contact with the second n-type well.

9. The memory structure of claim 8, wherein the other pick-up region comprises a gate-all-around (GAA) device, wherein the GAA device comprises a p-type fin structure formed on a p-type substrate and a p-type source/drain region on the p-type fin structure.

10. The memory structure of claim 1, wherein the pick-up region is electrically coupled to a memory cell of the plurality of memory cells.

11. A memory structure, comprising:
 a memory cell array comprising:
  a plurality of memory cells; and
  a plurality of first n-type wells extending in a first direction, wherein each of the plurality of first n-type wells comprises a far-end boundary and a near-end boundary opposite to the far-end boundary;
 a second n-type well extending in a second direction perpendicular to the first direction, wherein the second n-type well is in contact with the far-end boundary of the each of the plurality of first n-type wells; and
 a plurality of first pick-up regions formed in the second n-type well, wherein each pick-up region is electrically coupled to the each of the plurality of first n-type wells through a plurality of second pick-up regions.

12. The memory structure of claim 11, further comprising a plurality of other pick-up regions, wherein each of the other pick-up regions is formed at the near end boundary of the each of the plurality of first n-type wells.

13. The memory structure of claim 11, further comprising a pre-charge circuit formed in the second n-type well.

14. The memory structure of claim 13, wherein the plurality of pick-up regions are electrically coupled to the pre-charge circuit.

15. The memory structure of claim 11, wherein the each of the plurality of pick-up regions comprises a gate-all-around (GAA) device, wherein the GAA device comprises an n-type fin structure formed on the second n-type well and an n-type doped source/drain region on the n-type fin structure.

16. A memory structure, comprising:
 a memory cell array comprising:
  a plurality of memory cells; and
  a plurality of first wells;
 a second well formed in a peripheral region of the memory structure, wherein the second well is in contact with one of the plurality of first wells; and
 a first pick-up region formed in the second well, wherein the first pick-up region abuts a second pick-up region and is electrically connected to the one of the plurality of first wells.

17. The memory structure of claim 16, wherein each of the plurality of first wells comprises a far-end boundary and a near-end boundary opposite to the far-end boundary.

18. The memory structure of claim 17, wherein the second well is in contact with a plurality of far-end boundaries.

19. The memory structure of claim 16, further comprising a pre-charge circuit formed in the second well.

20. The memory structure of claim 19, wherein the pick-up region is electrically coupled to the pre-charge circuit.

* * * * *